Aug. 4, 1959 D. C. HOESTEREY 2,898,477

PIEZOELECTRIC FIELD EFFECT SEMICONDUCTOR DEVICE

Filed Oct. 31, 1955

INVENTOR
D. C. HOESTEREY
BY Harry C. Hart
ATTORNEY 2,898,477

PIEZOELECTRIC FIELD EFFECT SEMICONDUCTOR DEVICE

Donald C. Hoesterey, Summit, N.J., assignor to Bell Telephone Laboratories, Incorporated, New York, N.Y., a corporation of New York Application October 31, 1955, Serial No. 543,853

11 Claims. (Cl. 307—88.5)

This invention relates to the controlling of electrical signals.

One general object of this invention is to provide new and improved means for and methods of controlling, for example, modulating, electrical signals. Another general object of this invention is to enable the efficient and expeditious transformation of a mechanical signal into an electrical signal.

In accordance with one broad feature of this invention, transformation of a mechanical signal into an electrical signal is effected by variation of an electrostatic field impressed upon a semiconductor body by a contiguous piezoelectric body which latter body has been stressed in accordance with the mechanical signal.

Bodies composed of certain materials, it is well known, exhibit piezoelectric properties; that is, when subjected to a mechanical stress these bodies develop an electrostatic charge between certain opposite surfaces. A direct analogy then lies between a body so charged and the dielectric material of charged capacitors. Indeed, the relationship goes beyond mere analogy and tends toward identity.

This effect has been employed usefully in many variations. One of the most useful has been the electro-acoustic transducer, for example, the crystal microphone. In such a device a piezoelectric crystal may be so arranged that acoustic waves may stress the crystal thereby producing a varying electrical charge on its opposite faces in accordance with the acoustic pressure signal. Customarily such a signal may be amplified for further utilization by well known techniques.

These devices, however, have been open to the objection that the electrical signals so derived are of a relatively low order of magnitude. Transmission of such low level signals from the originating point to the utilization point has then been subject to well known transmission losses and interference pick-up such that the desired electrical signal may become submerged in unwanted noise. Those skilled in the art have solved this problem by providing suitable electrical amplifying devices in proximity to the electro-acoustic transforming device. But such amplifiers carry with them their own defect of physical awkwardness. It is then a specific object of the applicant to provide an electro-acoustic transducer containing an integral electrical signal amplifier of minor physical proportions.

This objective, and others herein set forth, the invention achieves with its recognition that the usefulness of the piezoelectric effect may be greatly extended in its employment with another well known phenomenon. Electric currents flowing in a semiconductor are particularly susceptible to the effects of electrostatic fields impressed upon that semiconductor. W. Shockley and G. L. Pearson, The Physical Review, July 15, 1948, volume 74, page 232, show quantitatively how such a field applied to the surface of a semiconductor body, as by condenser plates, may control the conductance of that body. Again, W. Shockley Patent 2,569,347, September 25, 1951, teaches the effect of an electrostatic field upon current flowing in a transistor.

Combining the teachings of Pearson and Shockley with the piezoelectric effect, the invention proceeds to provide a method and means for converting mechanical energy into electrical energy and, with the very devices used for this conversion, effecting an amplification of the electrical signal so derived.

Other objects and features of the invention will appear from a detailed study of the drawings in which.

Figure 1:
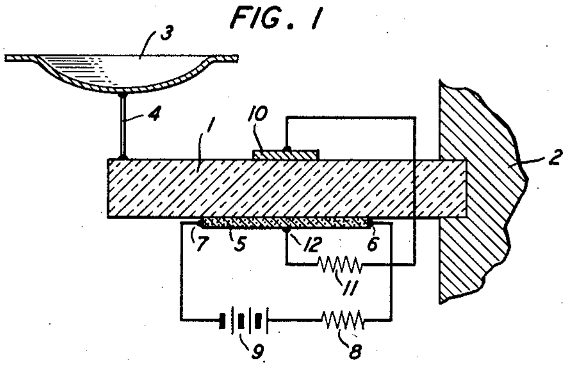
Fig. 1 shows one embodiment of the invention with an appropriate circuit.

Referring now to Fig. 1 of the drawings, a square rod 1 composed of piezoelectric material, for example Rochelle salt, is mounted by one end on a suitable support 2. Acoustic energy from a source, not shown, impinges on a diaphragm 3 and, through a suitable linkage 4, stresses the rod 1 in accordance with variations of that acoustic energy. By virtue of its piezoelectric properties, the rod 1, under the influence of this acoustic stress, separates electric charges on its opposite faces.

A thin film 5 of semiconductor material, conveniently p-type germanium, is applied to one surface of the rod 1. An input electrode 6 and an output electrode 7 are connected at opposite ends of the film 5 through a load 8, to a source of biasing potential, a battery 9. A first field electrode 10 is fixed to a face of the rod 1 opposite that to which the film 5 is applied. This electrode is connected through a resistor 11 and a second field electrode 12 to the film 5. The resistor 11, being connected in series with the capacitance effectively formed by the stressed rod 1, governs the discharge time constant of that capacitance. So the resistor 11 is chosen of suitable value that the charged rod 1 discharges through the resistor 11 and film 5 at a rate consistent with the frequency range throughout which acoustic energy stresses the rod 1.

Though for clarity of illustration the elements of the invention are shown in the drawings with disproportionate dimensions, the film 5 may advantageously be of a thickness approximating $10^{-4}$ centimeters. Such a small dimension leads to an intense electrostatic field effect on current carriers throughout the particular cross section of the semiconductor between the second field electrode 12 and the semiconductor-piezoelectric interface.

The intimacy of the contact between a film and the rod 1 further heightens the intensity of this effect by effectively eliminating an air dielectric capacitance in series with the capacitance represented by the opposite surfaces of the rod 1.

Now the battery 9 provides, relative to the piezoelectric energy developed, an unlimited amount of electric power to flow through the semiconductor 5 to the load 8. But the piezoelectric energy, by practice of the invention, modulates this energy flow in the semiconductor 5 and thus that piezoelectric energy is itself effectively amplified in the load 8. And amplified, indeed, in a modulation process whose effectiveness is heightened by the very thinness of the film 5 which is combined with the basic electroacoustic transducer, the piezoelectric rod 1.

It is well here to observe that this structure of applicant develops a cumulative modulation of current flowing in the semiconductor film 5. Patent 2,866,014 of F. P. Burns, issued December 23, 1958, and the copending application of W. P. Mason, Serial No. 543,859, filed October 31, 1955, describe an employment of the principle that the conductance of a semi-conductor is varied by a strain developed in it. In accordance with this principle, stressing the present invention's piezoelectric rod 1 strains the film 5. As a result, the current flowing in the film 5 is modulated not only by the piezoelectrical field but by the strain-induced variation of the conductance of the film 5.

Figure 2:
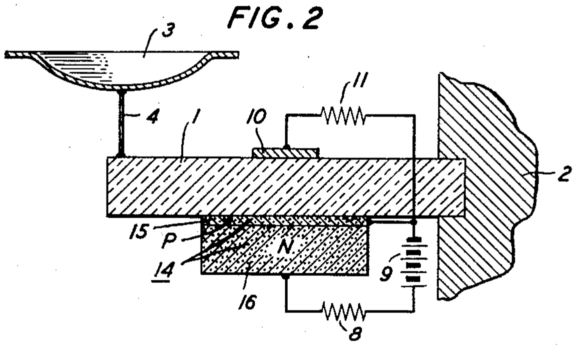
Fig. 2 shows a second illustrative embodiment of the invention.

Referring now to Fig. 2, a diaphragm 3 is connected by linkage 4 to a piezoelectric element 1 in the manner of Fig. 1. Unlike Fig. 1, however, a diode junction transistor 14, reversely biased by the battery 9, is so mounted with respect to the piezoelectric element as to be influenced in much the fashion of the thin semiconductor film 5 shown in Fig. 1. The diode 14 comprises a first thin semiconductor layer 15 of one conductivity of type, say p-type, and a second semiconductor layer 16 of an opposite conductivity type, n-type. The junction of the two layers is so disposed as to lie substantially parallel to the interface contact between layer 15 and the piezoelectric member 1. J. Bardeen Patent 2,524,033, October 3, 1950, explains how the reverse resistance of such a diode transistor is materially altered under the influence of an electrostatic field such as that produced by the piezoelectric element 1. Thus, as discussed in consideration of Fig. 1, acoustic energy impinging on the diaphragm 3 modulates the current flowing under the influence of battery 9, through the diode 14 to the load 8.

Figure 3:
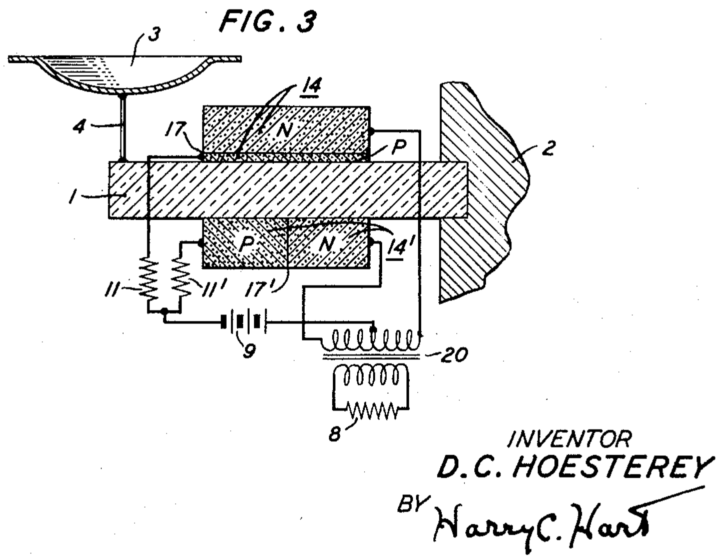
Fig. 3 shows still a third embodiment of the invention wherein a cumulative control is exerted by appropriate component arrangements.

Turning now to Fig. 3, there is seen a piezoelectric element 1 arranged for actuation by a diaphragm 3 through a linkage 4, again in the manner discussed in consideration of Fig. 1. Contiguous to the element 1 are transistor junction diodes 14 and 14', so disposed as to be influenced in phase opposition by a field generated by the element 1. Like-poled regions of diodes 14 and 14' are connected in push-pull through a transformer 20 to the load 8 and a suitable reverse biasing potential is applied to each by the battery 9 through the resistors 11 and 11' respectively. While normally such arrangements employ symmetrical elements, the diode junctions 17 and 17' are shown for illustrative purposes to be respectively parallel and perpendicular to the interfaces between the piezoelectric element 1 and the diodes 14 and 14'. The operation of the parallel junction diode 14 has been considered. And W. Shockley Patent 2,569,347, September 25, 1951, shows that a current flowing across a transistor junction may be controlled by an electrostatic field applied at that junction. Such a field is applied to the diode 14' at its junction 17' by the stressed rod 1. Thus the conductance of the diodes 14 and 14', according to the teachings of Bardeen and Shockley, respectively, is controlled in response to a stress applied to piezoelectric element 1. By the spatial relationship of these diodes 14 and 14' with respect to the controlling piezoelectric element 1, the currents flowing in these diodes 14 and 14' vary in phase opposition. Such variation, in accordance with well known theory, reduces harmonic distortion in the output signal and the dual use of the piezoelectric effect promotes more efficient utilization of the mechanical energy impressed upon piezoelectric element 1.

These embodiments of the invention are illustrative of features of the invention only and in no wise are to be considered restrictive thereof.

What is claimed is:

1. An electrical translating device which comprises an elastic member of piezoelectric material, signal-operated means for mechanically inducing a strain in said member whereby a surface charge appears on said member in proportion to its piezoelectric properties and to strains induced by said means, a semiconductive body disposed to form an interface with said member and having a conductance responsive to an electrostatic field, circuit means for interconnecting a surface of said member with a surface of said body, said surfaces being disposed on opposite sides of said interface, electrodes oppositely connected to said semi-conductive body for carrying an electrical current through said body, and means for applying a current to said electrodes whereby said current is modulated in accordance with strains induced in said member by said signal-operated means.

2. Apparatus as set forth in claim 1 wherein said semiconductive body comprises a region of one conductivity type material having a thickness in the order of $10^{-4}$ centimeters, and forming said interface with said member.

3. Apparatus as set forth in claim 1 wherein said semiconductive body comprises a first zone of one conductivity type material contiguous to said member and having a thickness in the order of $10^{-4}$ centimeters, a second zone of an opposite conductivity type, said second zone forming a junction with said first zone, said junction being substantially parallel to said interface, and means for biasing said junction in a reverse direction.

4. Apparatus as set forth in claim 1 wherein said semiconductive body comprises at least one zone of a first conductivity type material, at least one zone of a second conductivity type material, said zones of opposite conductivity types forming at least one junction intersecting said interface, and means for reversely biasing said junction.

5. An electrical translating device which comprises an elastic member of piezoelectric material, signal-operated means for mechanically inducing strains in said member whereby a surface charge appears on said member in proportion to its piezoelectric properties and to strains induced by said signal-operated means, at least a first and a second semiconductive body disposed to form interfaces with said member respectively and arranged to be influenced in phase opposition by a surface charge appearing thereon, a balanced load connected in series with said bodies, means for applying an electrical current to said bodies in parallel through said balanced load whereby currents flowing in said bodies are modulated in phase opposition by strains induced in said member and are thereafter delivered in phase to said load.

6. Apparatus as set forth in claim 5 wherein at least one of said bodies comprises a zone of one conductivity type having a thickness in the order of $10^{-4}$ centimeters, said zone forming said interface with said member.

7. Apparatus as set forth in claim 5 wherein at least one of said bodies comprises a first zone of one conductivity type forming a junction with a second zone of an opposite conductivity type and wherein said current applying means comprises means for reversely biasing said junction.

8. Apparatus as set forth in claim 5 wherein at least one of said bodies comprises a first zone of one conductivity type having a thickness in the order of $10^{-4}$ centimeters, said first zone forming said interface with said member, and a second zone of an opposite conductivity type, said first and second zones forming a junction substantially parallel to said interface, and wherein said current applying means comprises means for reversely biasing said junction.

9. Apparatus as set forth in claim 5 wherein at least one of said bodies comprises a first zone of one conductivity type and a second zone of an opposite conductivity type said first and second zones forming a junction substantially normal to said interface and wherein said current applying means comprises means for reversely biasing said junction.

10. An electrical translating device which comprises an elastic member of piezoelectric material, signal-operated means for mechanically inducing a strain in said member, whereby an electric charge appears on opposite surfaces of said member in dependence on its piezoelectric properties, a semiconductive body fixed to said member thereby to form an interface with said member, said body having a conductance responsive to an electrostatic field, circuit means for interconnecting surfaces of said body and said member, said surfaces being disposed on opposite sides of said interface, whereby an electrical field is applied to said body in response to strains induced in said member, electrodes oppositely connected to said semiconductive body for carrying an electric current through said body, and means for applying an electric current to said electrodes, whereby said current is controlled in response to strains induced in said member by said signal-operated means.

11. Apparatus as set forth in claim 1, wherein said semiconductive body comprises a region of one conductivity type having a dimension transverse to said interface which is small compared to a like dimension of said member.

References Cited in the file of this patent

UNITED STATES PATENTS

| | | |
|---|---|---|
| 2,522,521 | Kock | Sept. 19, 1950 |
| 2,549,550 | Wallace | Apr. 17, 1951 |
| 2,558,563 | Janssen | June 26, 1951 |
| 2,569,347 | Shockley | Sept. 25, 1951 |
| 2,589,983 | Blodgett | Mar. 18, 1952 |
| 2,695,357 | Donley | Nov. 23, 1954 |
| 2,724,171 | Wallace | Nov. 22, 1955 |
| 2,745,010 | Stansel | May 8, 1956 |
| 2,791,758 | Looney | May 7, 1957 |
| 2,791,759 | Brown | May 7, 1957 |